(12) United States Patent  (10) Patent No.: US 7,732,926 B2
Uchiyama  (45) Date of Patent: Jun. 8, 2010

(54) SEMICONDUCTOR DEVICE HAVING A THROUGH ELECTRODE WITH A LOW RESISTANCE AND METHOD OF MANUFACTURING THE SAME

(75) Inventor: Shiro Uchiyama, Tokyo (JP)

(73) Assignee: Elpida Memory, Inc., Chuo-ku, Tokyo (JP)

(*) Notice: Subject to any disclaimer, the term of this patent is extended or adjusted under 35 U.S.C. 154(b) by 364 days.

(21) Appl. No.: 11/636,612

(22) Filed: Dec. 11, 2006

(65) Prior Publication Data

US 2007/0134819 A1    Jun. 14, 2007

(30) Foreign Application Priority Data

Dec. 12, 2005   (JP)   .............................. 2005-357819

(51) Int. Cl.
*H01L 23/48* (2006.01)
*H01L 21/4763* (2006.01)

(52) U.S. Cl. .............................. 257/774; 257/E21.175; 257/E21.575; 257/E21.597; 257/E23.011; 438/622; 438/637

(58) Field of Classification Search .................. None
See application file for complete search history.

(56) References Cited

U.S. PATENT DOCUMENTS 7,323,785 B2 *   1/2008   Uchiyama .................... 257/774

FOREIGN PATENT DOCUMENTS

| JP | 8-78699 | 3/1996 |
|---|---|---|
| JP | 2002-289623 | 10/2002 |
| JP | 2003-17558 | 1/2003 |
| JP | 2004-228308 | 8/2004 |
| JP | 2004-273483 | 9/2004 |
| JP | 2005-94044 | 4/2005 |

* cited by examiner

*Primary Examiner*—Alonzo Chambliss
(74) *Attorney, Agent, or Firm*—McGinn Intellectual Property Law Group, PLLC (57) ABSTRACT

A method of manufacturing a through electrode. While using at least a first conductive film for a gate electrode as a mask, an inner trench and a peripheral trench is formed. The Inner trench is provided for an inner through electrode having a columnar semiconductor. The peripheral trench is provided for a peripheral through electrode around an annular semiconductor surrounding the inner trench. The inner trench and the peripheral trench are filled with a through electrode insulation film and a through electrode conductive film, respectively, to form an inner through electrode and a peripheral through electrode.

27 Claims, 7 Drawing Sheets

FIG. 1

RELATED ART

FIG. 2

RELATED ART

SEMICONDUCTOR DEVICE HAVING A THROUGH ELECTRODE WITH A LOW RESISTANCE AND METHOD OF MANUFACTURING THE SAME

This application claims priority to prior Japanese patent application JP 2005-357819, the disclosure of which is incorporated herein by reference.

BACKGROUND OF THE INVENTION

The present invention relates to a semiconductor device, and more particularly to a semiconductor device having a through electrode which forms a three-dimensional semiconductor device, and to a method of manufacturing such a semiconductor device.

Three-dimensional semiconductor devices having a plurality of stacked semiconductor devices have been proposed in recent years. In these three-dimensional semiconductor devices, the respective semiconductor devices are electrically connected to each other by through electrodes, which extend through semiconductor substrates.

Figure 1:
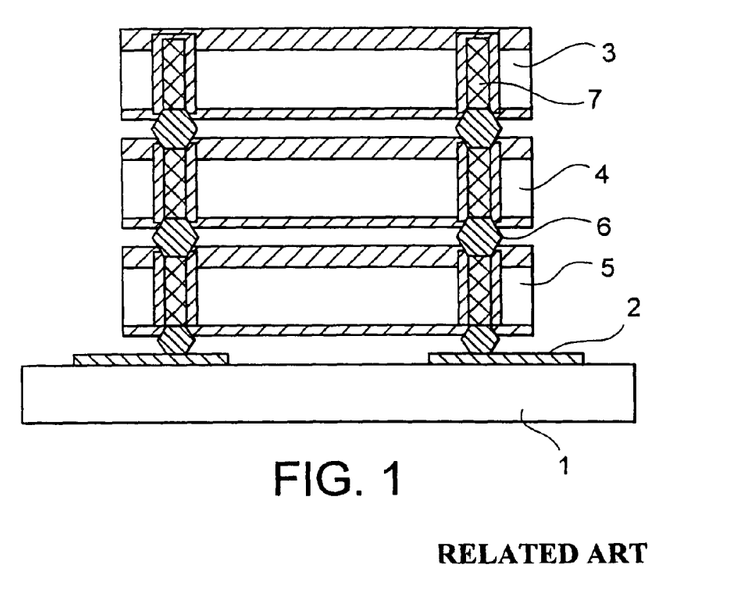
FIG. 1 is a cross-sectional view showing a three-dimensional semiconductor device.
Figure 2:
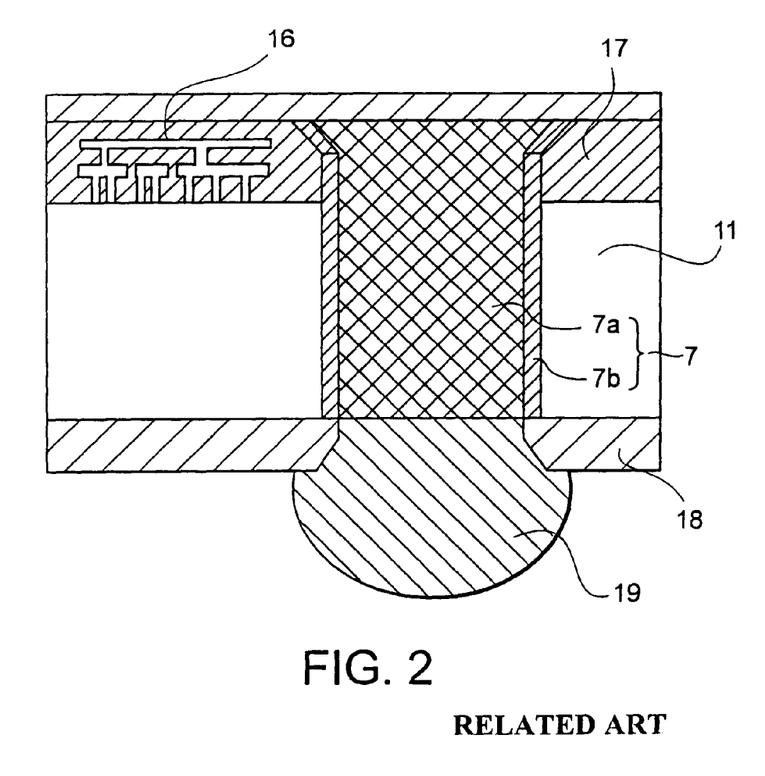
FIG. 2 is a cross-sectional view showing a conventional through electrode.

FIGS. 1 and 2 show a conventional three-dimensional semiconductor device. The three-dimensional semiconductor device shown in FIG. 1 has three semiconductor devices 3, 4, and 5 and a support substrate 1 on which the semiconductor devices 3, 4, and 5 are mounted. Each semiconductor device has a through electrode 7 extending through a semiconductor substrate. The semiconductor devices are connected to each other by bumps 6, which are connected to the through electrodes 7, and also connected to a wiring pattern 2 on the support substrate 1. FIG. 2 is a cross-sectional view of one through electrode 7. The illustrated through electrode 7 is produced after completion of a wiring process in a semiconductor fabrication process.

An opening is formed in an insulation film 17 in a state in which interconnections 16 are formed in the semiconductor device. A trench is formed in the semiconductor substrate 11. A through electrode insulation film 7b is deposited on an inner wall of the trench. Further, the trench is filled with a through electrode conductive film 7a. Then, an upper surface of the through electrode conductive film 7a is flattened by CMP or the like so as to have the same height as a surface of the semiconductor. A rear face of the semiconductor substrate 11 is ground so that the semiconductor substrate 11 has a predetermined thickness. A rear insulation film 18 is deposited on the rear face of the semiconductor substrate 11. Then, an opening is formed in the rear insulation film 18, and a bump 19 is formed in the opening. A bump 19 may be formed on the front face of the semiconductor substrate as needed. If no bump is formed on the semiconductor substrate, a protective insulation film is formed on the semiconductor substrate.

These through electrodes are used as power source lines and signal lines. Accordingly, It is desirable that the through electrodes have a low wiring resistance and a small stray capacitance. Through electrodes having a high wiring resistance cause reduction of a voltage and delay of signals to thereby lower an operating speed. Finally, the semiconductor may not work. Further, if through electrodes have a large capacity, a signal waveform is disturbed by delay of signals and noise between signals, so that high-speed data transfer cannot be performed. Accordingly, in order to reduce a resistance of a through electrode, it is necessary to increase a diameter of a trench formed in a semiconductor substrate and fill the trench with a conductive film. Further, in order to reduce a capacity of a through electrode, it is necessary to thicken an insulation film between a semiconductor substrate and a conductive film and to use an insulation film having a small dielectric constant. However, only limited types of insulation films can be used in a semiconductor fabrication process. As a result, it is necessary to increase a film thickness of an insulation film.

Accordingly, in order to produce a through electrode, a trench having a diameter of several tens of micrometers should be formed in a semiconductor substrate, and a through electrode insulation film 7b should be deposited as thick as several micrometers to several tens of micrometers. In the prior art, when a conductive film or an insulation film having a film thickness in the above range, deposition should be performed for a long period of time. Thus, a heavy load is imposed on a manufacturing process. Further, in a case of deposition of a conductive film having a thickness of several tens of micrometers, the deposited grain becomes non-uniform as the film thickness becomes larger. The non-uniform grain causes variation of properties of the conductive film so as to increase a resistivity of the conductive film. Thus, it has been desired to develop a structure of a through electrode having a low resistance and a small capacity, and to establish a method of manufacturing such a through electrode.

Japanese laid-open patent publications Nos. 2003-017558 and 2002-289623 relate to through electrodes. Japanese laid-open patent publication No. 2003-017558 discloses forming a trench having a diameter of several tens of micrometers in a semiconductor substrate, then filling the trench with an application insulation film, etching the semiconductor substrate to form a trench in the semiconductor substrate, and depositing a conductive film in the trench to produce a through electrode with the conductive film having no cavities. Japanese laid-open patent publication No. 2002-289623 discloses a second insulation area provided outside of a through electrode to prevent short-circuits between the through electrode and a semiconductor substrate.

Japanese laid-open patent publications Nos. 2005-094044, 2004-228308, 08-078699, and 2004-273483 relate to methods of forming a via hole, a through hole, and a contact hole. Japanese laid-open patent publications Nos. 2005-094044 and 2004-228308 disclose that insulation films having different etching rates are deposited on an upper side of a gate electrode and on a side surface of the gate electrode to form self-aligning contact. Japanese laid-open patent publication No. 08-078699 discloses forming a diffusion layer while using a gate electrode as a mask. Japanese laid-open patent publication No. 2004-273483 discloses an etching method for forming a hole in an interlayer dielectric. However, these publications fail to teach or disclose a structure of a through electrode having a small capacity with respect to a semiconductor substrate and a low resistance, and a method of manufacturing such a through electrode.

As described above, a conventional through electrode used in a three-dimensional semiconductor device has the following problems: The resistance of the through electrode is so large that high-speed data transfer cannot be performed. A deposition time of an embedded conductive film becomes long because the embedded conductive film of the through electrode should have a large film thickness.

SUMMARY OF THE INVENTION

The present invention has been made in view of the above drawbacks. It is, therefore, an object of the present invention to provide a method of manufacturing a through electrode having a low resistance which can shorten an embedding time of a conductive film and can form the through electrode with a conductive film having a low resistance, and also a semiconductor device having such a through electrode which can perform high-speed data transfer.

In order to resolve the above problems, the present invention basically adopts the following technology. As a matter of course, the present invention covers applied technology in which various changes and modifications are made therein without departing from the spirit of the present invention.

According to one aspect of the present invention, a method of manufacturing a through electrode is provided. The method includes the steps of: while using at least a first conductive film for a gate electrode as a mask, forming a inner trench for an inner through electrode having a columnar semiconductor and a peripheral trench for a peripheral through electrode around an annular semiconductor surrounding the inner trench; and filling the inner trench and the peripheral trench with a through electrode insulation film and a through electrode conductive film, respectively, to form an inner through electrode and a peripheral through electrode.

In this method, the columnar semiconductor may be provided in the inner trench so that the inner trench is filled with a through electrode conductive film having a film thickness smaller than that in a case of no columnar semiconductor.

The method may further include the step of forming a second conductive film for the gate electrode on the first conductive film so that a connecting portion of the inner through electrode is formed by the second conductive film while the peripheral through electrode is in a floating state.

The first and second conductive films may be simultaneously patterned with a gate electrode pattern of a transistor.

A wiring process for the through electrode and a wiring process for the gate electrode may be performed in a same step.

The first conductive film may be made of a material selected from a group consisting of polysilicon and compounds of refractory metal and silicon.

The second conductive film may be made of a material selected from a group consisting of refractory metal, silicides of refractory metal, and nitrides of refractory metal.

The through electrode conductive film may made of a material selected from a group consisting of refractory metal, silicides of refractory metal, and nitrides of refractory metal.

According to another aspect of the present invention, a semiconductor device is provided. The semiconductor device includes: an inner trench for an inner through electrode having a columnar semiconductor, the inner trench being formed while at least a first conductive film for a gate electrode is used as a mask; an peripheral trench for a peripheral through electrode formed around an annular semiconductor surrounding the trench for an inner through electrode, the peripheral trench being formed while at least a first conductive film for a gate electrode is used as a mask; and an inner through electrode and a peripheral through electrode formed by filling the inner trench and the peripheral trench with a through electrode insulation film and a through electrode conductive film, respectively.

In a method of manufacturing a through electrode according to the present invention, a first conductive film for a gate electrode is formed as a mask. A second conductive film for the gate electrode is deposited on the first conductive film and used as a wiring electrode of a through electrode. Since the through electrode is formed during a gate electrode formation process, a refractory metal or a compound thereof can be used to form a through electrode. Accordingly, the through electrode can have a low resistance. Further, since a connection wiring process of the through electrode and a connection wiring process of the gate electrode are simultaneously performed, a period of time required for the entire process can advantageously be shortened. With such an arrangement, it is possible to provide a through electrode having a low resistance and a semiconductor device having such a through electrode.

DESCRIPTION OF THE PREFERRED EMBODIMENTS

Figure 3A:
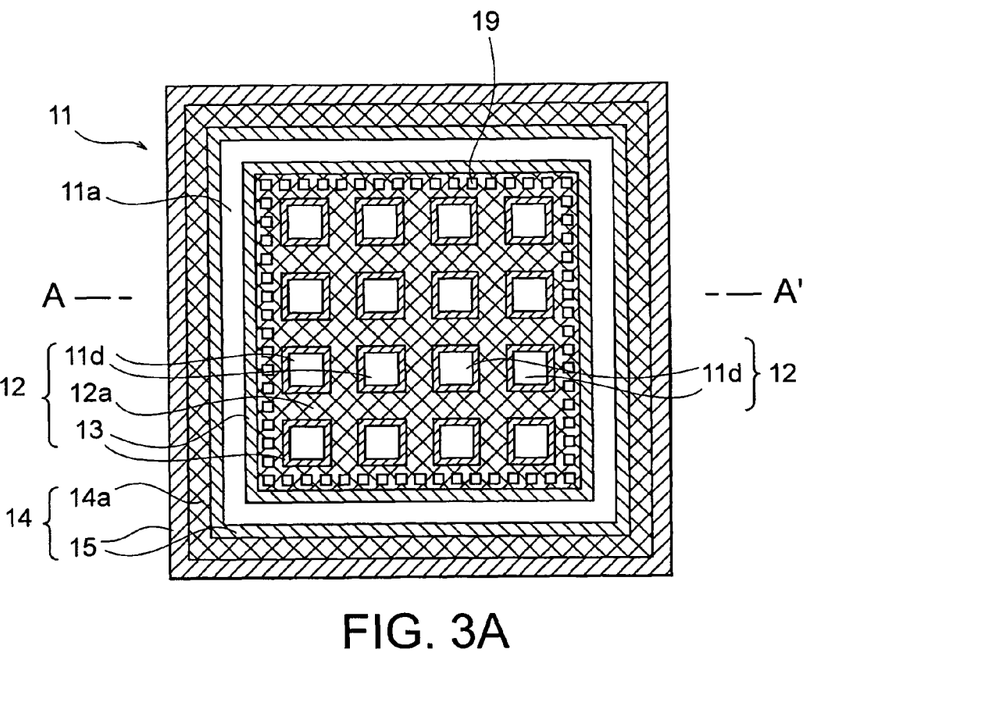
FIG. 3A is a plan view showing a through electrode according to the present invention.
Figure 3B:
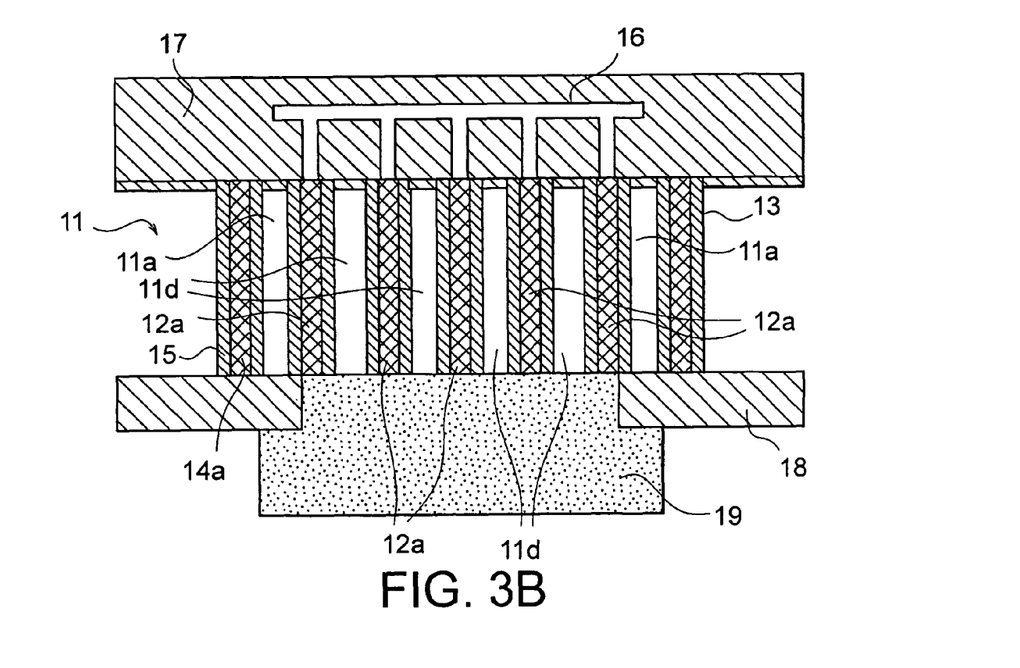
FIG. 3B is a cross-sectional view taken along line A-A'.

A preferred embodiment of the present invention will be described with reference to FIGS. 3A and 3B. FIGS. 3A and 3B show a structure of a through electrode according to the present invention. FIG. 3A is a plan view showing the structure of the through electrode, and FIG. 3B is a cross-sectional view taken along line A-A' of FIG. 3A.

The through electrode of the present invention has a double through electrode structure including an inner through electrode 12 and a peripheral through electrode 14 in a semiconductor substrate 11. The peripheral through electrode 14 is formed like a ring in the semiconductor substrate 11. An annular semiconductor 11a is formed inside of the peripheral through electrode 14. The inner through electrode 12 is formed so as to be surrounded by the annular semiconductor 11a. The inner through electrode 12 serves as an actual through electrode. No potential is supplied to the peripheral through electrode 14 and the annular semiconductor 11a, which are in a floating state. Thus, the peripheral through electrode 14 and the annular semiconductor 11a are provided in order to reduce a capacity between the semiconductor substrate 11 and the inner through electrode 12. The inner through electrode 12 and the peripheral through electrode 14 are formed within a trench defined in the semiconductor substrate 11. Each of the inner through electrode 12 and the peripheral through electrode 14 has a through electrode insulation film for insulation from surrounding semiconductors and a through electrode conductive film surrounded by the insulation film.

The peripheral through electrode 14 is formed within an annular trench defined between the semiconductor substrate 11 and the annular semiconductor 11a. The peripheral through electrode 14 has peripheral through insulation films 15 for insulation from the semiconductor substrate 11 and the annular semiconductor 11a, and a peripheral through conductive film 14a inside of the peripheral through insulation films 15. The inner through electrode 12 is formed within a trench defined in the annular semiconductor 11a. A plurality of columnar semiconductors (columnar semiconductor portions) 11d are formed within a trench for an inner through electrode. The inner through electrode 12 has inner through insulation films 13 between the columnar semiconductors 11d and the annular semiconductor 11a and between adjacent columnar semiconductors 11d, and an inner through conductive film 12a.

The inner through electrode 12 is formed between the annular semiconductor 11a and the columnar semiconductors 11d. The columnar semiconductors 11d are spaced from the annular semiconductor 11a at equal intervals and located so as to have equal intervals between adjacent columnar semiconductors 11d. These intervals allow the insulation films and the conductive film of the inner through electrode to be deposited so as to be filled equally into between the columnar semiconductors with a small film thickness. In order to fully fill a film into a trench, the film is required to have a film thickness larger than a half of a diameter of the trench. The inner area of the inner through electrode is divided by the columnar semiconductors arranged at equal intervals. By reducing the equal intervals of the columnar semiconductors, the required film thickness to be deposited can be reduced. Further, the film can uniformly be filled by arranging the columnar semiconductors at the equal intervals.

For example, in FIG. 3A, square columnar semiconductors are arranged with four rows and four columns. It is assumed that an outer square has a width of 30 μm and each columnar semiconductor within the outer square has a width of 2 μm. When the insulation film has a thickness of 0.1 μm, the inner through electrode can be filled with a conductive film having a thickness of about 2 μm. If the inner through electrode is not divided by columnar semiconductors, then it is necessary to fill a conductive film having a film thickness of at least 15 μm, which is a half of the width of the outer square (30 μm). The divided inner through electrode needs only one seventh of the film thickness required in a case where the inner through electrode is not divided by columnar semiconductors. Thus, the inner through electrode can be filled with a film having a small film thickness. Accordingly, a period of time required for embedding a conductive film in a manufacturing process can be reduced, and loads on a production line can also be reduced. Further, it is possible to obtain uniform quality of the film because of a small film thickness. Accordingly, it is possible to obtain an inner through electrode having a low resistance.

Further, it is desirable that each of the columnar semiconductors 11d is in the form of a square or a rectangle because the columnar semiconductors 11d are arranged at equal intervals. However, the shape of the columnar semiconductors 11d is not limited to specific ones, and the columnar semiconductors 11d may have any shape as long as the columnar semiconductors are arranged substantially at equal intervals so that a conductive film can uniformly be filled into spaces between the columnar semiconductors. Further, only one columnar semiconductor may be disposed, or a plurality of columnar semiconductors may be disposed. By reducing the size of the columnar semiconductors, an area in which the columnar semiconductors are formed is reduced so as to increase a ratio of an area in which the conductive film is formed. Accordingly, it is possible to obtain an inner through electrode having a lower resistance. The resistance of the through electrode varies according to the shapes of the inner through electrode 12 and the columnar semiconductors 11d. Therefore, the shapes of the inner through electrode 12 and the columnar semiconductors 11d can be changed depending on a resistance or a capacity required for a through electrode.

The peripheral through electrode 14 is insulated and isolated from the annular semiconductor 11a and the semiconductor substrate 11, respectively, by the peripheral through electrode insulation films 15. The peripheral through electrode 14 and the annular semiconductor 11a are not connected to any potential wiring line and are thus in a floating state. Since the peripheral through electrode 14 is in a floating state, it does not serve as an electrode. Accordingly, the peripheral through conductive film 14a may be eliminated so that the peripheral through electrode 14 is formed by one peripheral through electrode insulation film 15. Thus, a space between the semiconductor substrate 11 and the annular semiconductor 11a, in which the peripheral through electrode 14 is formed, can be made equal to or smaller than the intervals between the columnar semiconductors 11d. Further, the annular semiconductor 11a and the peripheral through electrode 14 may be doubted.

Further, since the peripheral through electrode 14 and the annular semiconductor 11a are in a floating state, it is possible to dramatically reduce a capacity between the semiconductor substrate 11 and the inner through electrode 12. The capacity between the semiconductor substrate 11 and the inner through electrode 12 is a synthesis capacity of series connection of a capacity between the semiconductor substrate 11 and the peripheral through electrode 14, a capacity between the peripheral through electrode 14 and the annular semiconductor 11a, and a capacity between the annular semiconductor 11a and the inner through electrode 12. Accordingly, the capacity between the semiconductor substrate 11 and the inner through electrode 12 is dramatically reduced. Furthermore, reduction of the capacity between the inner through electrode 12 and the semiconductor substrate 11 eliminates limitation on the film thickness of an insulation film. For the film thickness of the inner through electrode insulation films 13 and the peripheral through electrode insulation films 15, only a withstand voltage should be considered. Accordingly, the film thickness of the inner through electrode insulation films 13 and the peripheral through electrode insulation films 15 can remarkably be reduced as compared to the film thickness of conventional insulation films. For example, the film thickness can be as small as not more than one third of the film thickness of the conventional insulation films.

A through electrode according to the present invention includes an inner through electrode in which columnar semiconductors are provided, an annular semiconductor, and a peripheral through electrode. Trenches are defined in the semiconductor substrate 11 to form the annular semiconductor 11a and the columnar semiconductors 11d. Since the columnar semiconductors 11d are provided, these trenches have a finer pattern as compared to trenches formed in a conventional through electrode formation process. Accordingly, it is desirable to form the through electrodes at the earliest possible timing before a wiring process.

Generally, through electrodes are formed during a wiring process or after a wiring process. However, in the case where through electrodes are formed after a wiring process, a variety of interlayer dielectrics are used in a space to a semiconductor substrate. The film thickness of the interlayer dielectrics is also large. When a various types of insulation films are etched simultaneously, a normal etching profile is unlikely to be obtained because the respective insulation films have different etching rates. Accordingly, a fine pattern cannot be obtained, and a large pattern is formed. If the formed pattern has large intervals between columnar semiconductors, the through electrode insulation films and the through electrode conductive films should have a large film thickness. Therefore, it is desirable to form the through electrodes in the earliest possible step.

A manufacturing process will briefly be described below. After an isolation process, trenches are formed for a peripheral through electrode and an inner through electrode. Insulation films and conductive films are deposited so as to form inner through electrode insulation films 13, peripheral through insulation films 15, an inner through electrode conductive film 12a, and a peripheral through electrode conductive film 14a. Then, a planarization process is performed. Polysilicon is used for the conductive film because polysilicon can cope with a high-temperature treatment in a well diffusion or the like. If metal is used for the conductive film, it is necessary to limit a high-temperature treatment and form a protective film against contamination. Thus, metal cannot be used because it becomes necessary to change conditions of a standard semiconductor process.

Then, a diffusion layer, transistors, interconnections 16, and the like are formed by a usual diffusion process. Interconnections for a through electrode are simultaneously formed during the wiring process. After completion of the wiring process, a rear face of the semiconductor substrate is ground until the semiconductor substrate is thinned so as to have a predetermined thickness. An insulation film 18 for protecting the semiconductor device is formed on the rear face of the semiconductor substrate. Further, an opening is formed in the insulation film 18 at a portion corresponding to the inner through conductive film 12a. A bump 19 is formed in the opening and connected to an exterior of the semiconductor device. In FIG. 3B, the bump 19 is formed on the rear face of the semiconductor substrate 11. Similarly, an opening may be formed in the insulation film 17, and a bump 19 may be formed on the front face of the semiconductor substrate 11. In this manner, a through electrode according to the present invention is manufactured.

A through electrode according to the present invention has an inner through electrode, and an annular semiconductor and a peripheral through electrode in a floating state around the inner through electrode. The inner through electrode includes columnar semiconductors arranged therein at equal intervals. The inner through electrode can have a low resistance by using a conductive thin film having a small thickness. Since the annular semiconductor and the peripheral through electrode are provided so as to be in a floating state, the capacity between the semiconductor substrate and the inner through electrode can be dramatically reduced. With such an arrangement, it is possible to provide a through electrode which has a low resistance and a small capacity and is easy to manufacture. Further, a semiconductor device which can perform high-speed data transfer can be provided with provision of this through electrode.

An example of a manufacturing method of a through electrode according to the present invention will be descried below with reference to FIGS. 4 through 15. The following manufacturing method of a through electrode can be applied to a standard semiconductor process without changing the standard semiconductor process to a large extent. In the following example, a through electrode is formed during a gate electrode formation process. FIGS. 4 through 15 are cross-sectional views of a semiconductor device according to a manufacturing process of a through electrode. In FIGS. 4 through 10, a cross-sectional view of one through electrode is illustrated on the left side of each drawing, and a cross-sectional view of a transistor is illustrated on the right side of each drawing. FIGS. 11 through 15 are cross-sectional views of one through electrode.

Figure 4:
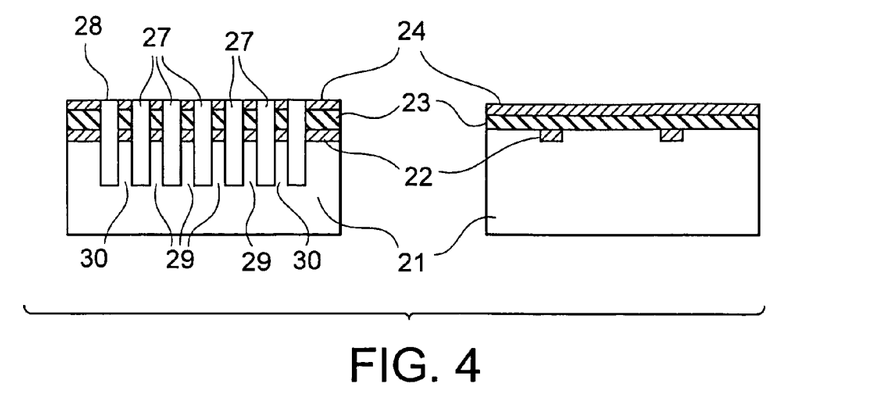
FIG. 4 is a cross-sectional view showing a process (trench formation) for forming a through electrode according to the present invention.

As shown in FIG. 4, a shallow trench isolation (STI) insulation film 22 for device isolation is formed on a semiconductor substrate 21. Further, a well diffusion layer (not shown) is formed, and then a gate insulation film and a gate polysilicon 23 as a first conductive film for a gate electrode are deposited thereon. These steps are the same as those in a usual process. The same process is performed on an area in which a through electrode is to be formed and on an area in which a transistor is to be formed. Further, a mask oxide film 24 for etching mask is deposited thereon. In order to form a through electrode, trenches 27 for an inner through electrode 25 and a trench 28 for a peripheral through electrode 26 are formed by lithography and etching technology. The trenches 27 and 28 for inner and peripheral through electrodes divide the silicon substrate 21 into an annular semiconductor 30 and columnar semiconductors 29.

The trenches 27 for an inner through electrode are designed so as to have the same width. The trench 28 for a peripheral through electrode is designed so as to have a width equal to or smaller than that of the trenches 27 for an inner through electrode. Since the trenches 27 for an inner through electrode have the same width, the trenches 27 can be filled uniformly with a conductive film having the same film thickness. At that time, the trench 28 can also be filled with a conductive film. In this case, patterning is not conducted on a transistor portion shown on the right side of FIG. 4. The gate polysilicon 23 may be made of any material used as a first conductive film for a gate electrode. Instead of polysilicon, silicide containing refractory metal can be used for the gate polysilicon 23.

Figure 5:
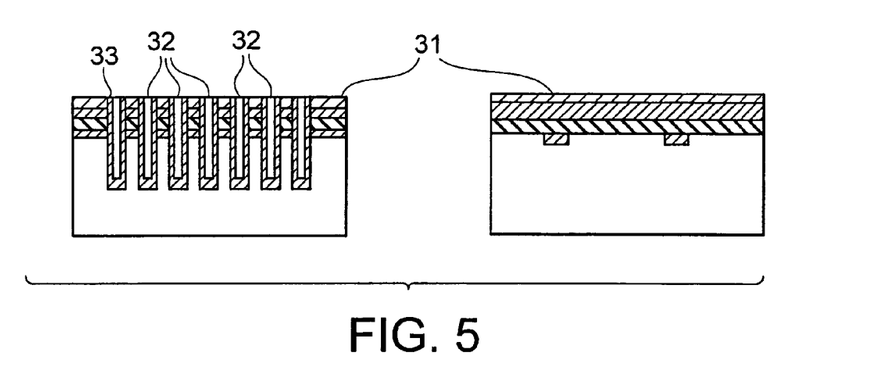
FIG. 5 is a cross-sectional view showing a process (sidewall insulation film deposition) for forming a through electrode according to the present invention.

Subsequently, as shown in FIG. 5, a sidewall insulation film 31 is deposited on the overall surface of the semiconductor substrate 21. The insulation film formed on the overall surface of the silicon substrate includes inner through electrode insulation films 32 formed in the trenches 27 for an inner through electrode 25 and a peripheral through electrode insulation film 33 formed in the trench 28 for a peripheral through electrode 26. The inner through electrode insulation films 32 serve to insulate columnar semiconductors from an annular semiconductor and insulate adjacent columnar semiconductors from each other. The peripheral through electrode insulation film 33 serves to isolate the annular semiconductor from the semiconductor substrate.

Figure 6:
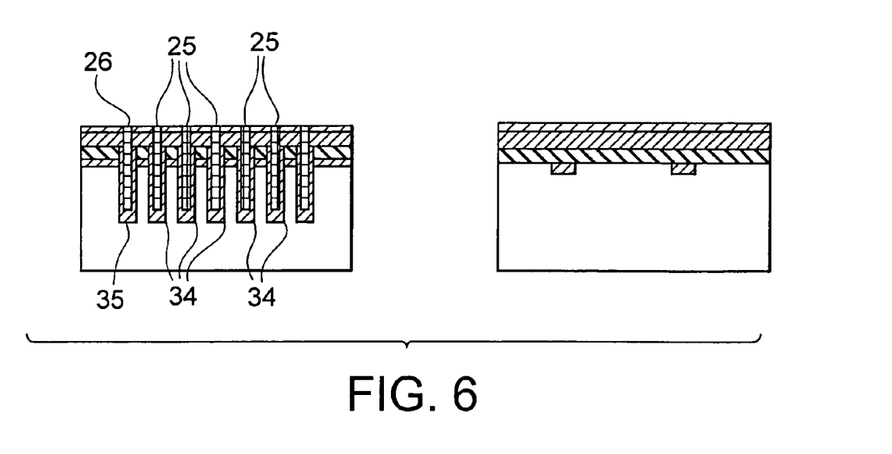
FIG. 6 is a cross-sectional view showing a process (planarization) for forming a through electrode according to the present invention.

As shown in FIG. 6, a conductive film is deposited on the overall surface of the semiconductor substrate 21 by using a CVD method. Thus, the trenches 27 for an inner through electrode 25 and the trench 28 for a peripheral through electrode 26 are filled with the conductive film. In this case, since the trenches 27 are divided at equal intervals by the columnar semiconductors 29, the trenches 27 can be filled with a conductive film having a small film thickness. The conductive film can have uniform quality and a low resistance with a small film thickness. The conductive film is formed on the overall silicon substrate. The conductive film includes an inner through conductive film 34 formed in the trenches 27 for an inner through electrode 25 and a peripheral through conductive film 35 formed in the trench 28 for a peripheral through electrode.

Then, a planarization process is performed so as to form an inner through electrode 25 and a peripheral through electrode 26 in the trenches. Materials for the conductive film include refractory metals such as tungsten and titanium, silicides of the refractory metals, and nitrides of the refractory metals. In this case, a CVD method, a sputtering method, or the like may be used as a deposition method. Since no potential is supplied to the peripheral through electrode 26 and used in a floating state, the trench 28 for the peripheral through electrode 26 may be made small in size and fully filled with an insulation film without a conductive film formed therein.

Figure 7:
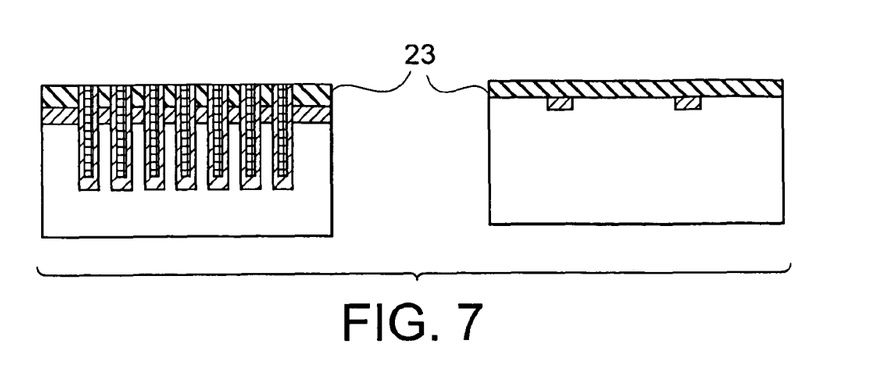
FIG. 7 is a cross-sectional view showing a process (mask oxide film removal) for forming a through electrode according to the present invention.
Figure 8:
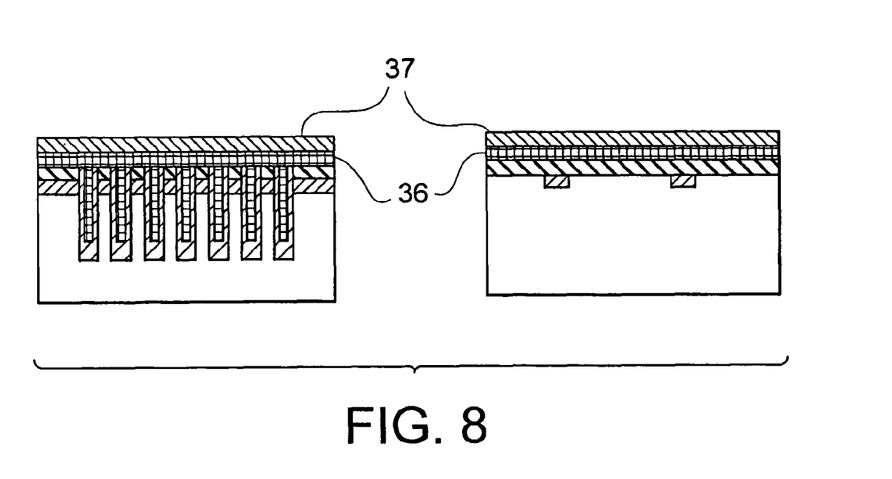
FIG. 8 is a cross-sectional view showing a process (nitride film deposition) for forming a through electrode according to the present invention.

Next, as shown in FIG. 7, the sidewall insulation film 31 and the mask oxide film 24 are removed so as to expose the gate polysilicon 23. The steps from deposition of the mask oxide film 24 to removal of the mask oxide film 24 are dedicated to a through electrode. As shown in FIG. 8, a gate electrode metal 36 and a nitride film 37 are deposited on the gate polysilicon 23. Materials for the gate electrode metal include refractory metals such as tungsten and titanium, silicides of the refractory metals, and nitrides of the refractory metals. Alternatively, these materials may be combined to form a plurality of layers in the gate electrode metal.

Figure 9:
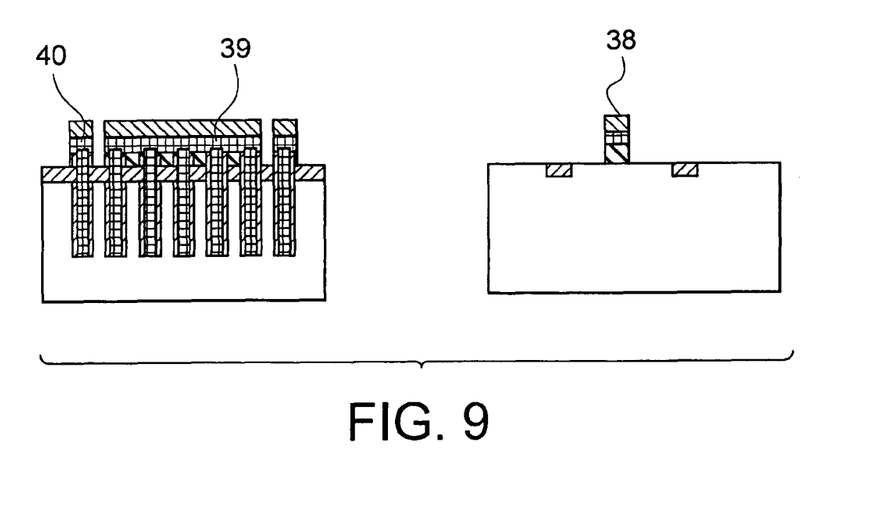
FIG. 9 is a cross-sectional view showing a process (gate patterning) for forming a through electrode according to the present invention.
Figure 10:
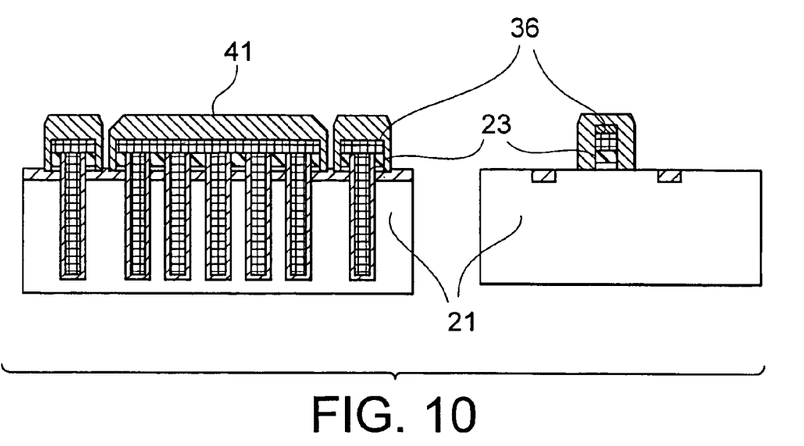
FIG. 10 is a cross-sectional view showing a process (nitride film deposition) for forming a through electrode according to the present invention.

As shown in FIG. 9, patterning of a gate electrode is conducted. In the gate patterning, a gate electrode 38 is formed at a transistor portion on the right side of FIG. 9, and connecting portions 39 and 40 for the inner through electrode 25 and the peripheral through electrode 26 are simultaneously formed. Further, a nitride film 41 is deposited thereon (FIG. 10). The nitride film 41 serves to protect the gate electrode for self-aligning contact. Formation of a nitride film is a standard semiconductor process for dynamic random access memories. By covering the through electrode with the nitride film 41, it is also possible to prevent contamination by metals from a second conductive film for the gate electrode and the through electrode.

The deposition of the gate electrode metal 36 and the nitride film 37, the lithography and etching for the gate electrode, and the deposition of the nitride film 41 are not specific to a through electrode and can also be used as a standard semiconductor process. Thereafter, a usual semiconductor process is performed. The connecting portions 39 and 40 for the inner through electrode 25 and the peripheral through electrode 26 include a gate polysilicon 23, a gate electrode metal 36, and a nitride film 37 as with a gate electrode of a usual transistor. Accordingly, the through electrode can be processed in the same manner as the gate electrode.

As described above, the through electrode is formed while the first conductive film for the gate electrode is used as a mask. Since refractory metals and compounds thereof can be employed for the conductive film of the through electrode, the resistance of the through electrode can be reduced to a low value. Further, the second conductive film for the gate electrode can be employed for the connecting portions of the through electrode. Furthermore, steps after the deposition of the second conductive film for the gate electrode, which include the gate patterning process and the patterning process of the connecting portions of the through electrode, are also performed in a standard semiconductor process. Thus, the same processes can be used. Accordingly, the surface of the through electrode has the same structure as the gate electrode. The number of steps dedicated to formation of the through electrode can be made small because the aforementioned steps can also be used for a standard semiconductor process. Thus, the method according to the present invention is advantageous in mass production.

Figure 11:
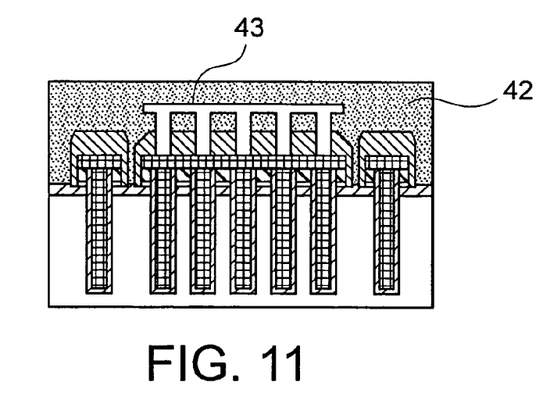
FIG. 11 is a cross-sectional view showing a process (wiring formation) for forming a through electrode according to the present invention.
Figure 12:
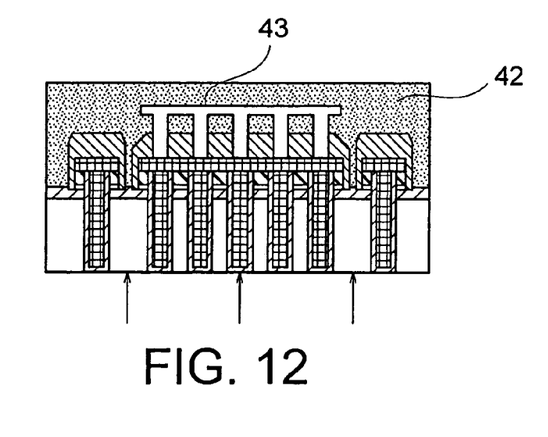
FIG. 12 is a cross-sectional view showing a process (rear grinding) for forming a through electrode according to the present invention.
Figure 13:
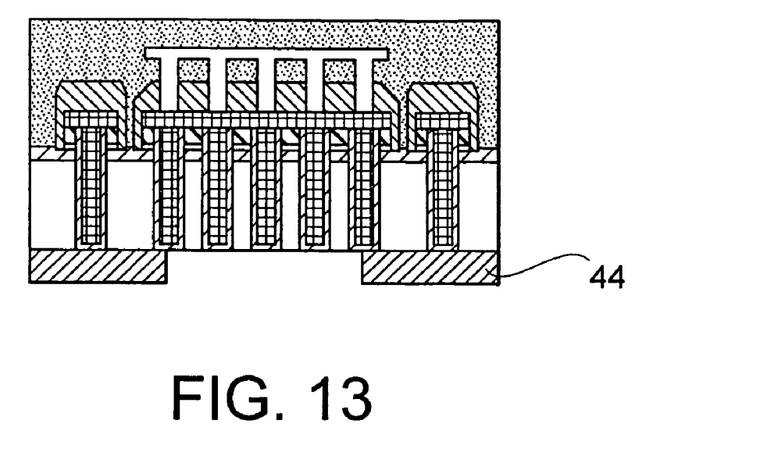
FIG. 13 is a cross-sectional view showing a process (rear insulation film opening) for forming a through electrode according to the present invention.
Figure 14:
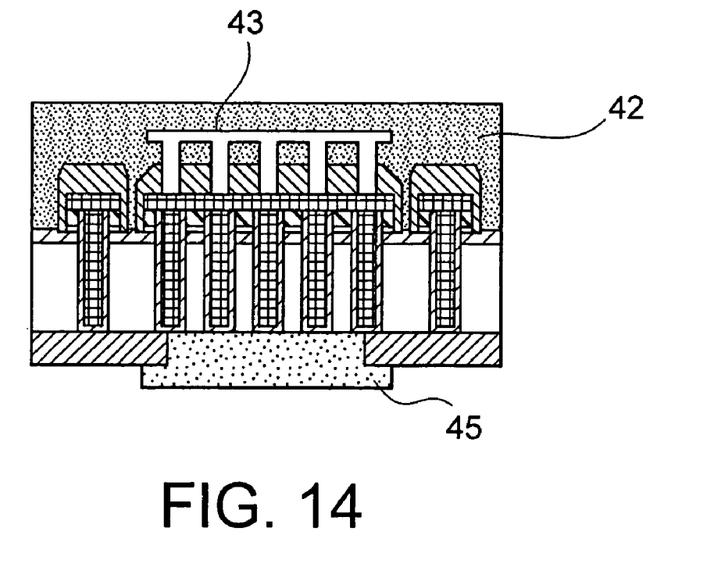
FIG. 14 is a cross-sectional view showing a process (bump formation) for forming a through electrode according to the present invention.

Then, an interlayer film 42 are formed, and interconnections 43 are formed in the interlayer film 42 (FIG. 11). Thus, a diffusion and wiring process of a semiconductor device is completed. The following steps are specific to a through electrode. As shown in FIG. 12, a rear face of the semiconductor substrate 21 is ground until the semiconductor substrate 21 is thinned so as to have a predetermined thickness. Specifically, the rear face of the semiconductor substrate 21 is ground and thinned until the inner through electrode 25 and the peripheral through electrode 26 are exposed. Grinding of the rear face of the semiconductor substrate 21 may be conducted halfway, and then secondary polishing such as wet polishing or dry polishing may be conducted. An insulation film 44 is deposited on the rear face of the semiconductor substrate 21, and a hole for a bump is formed in the insulation film 44 (FIG. 13). Then, a bump 45 is formed in the hole (FIG. 14). If a bump is formed on the front face of the substrate, a hole for a bump is formed in the interlayer film 42 and a bump is formed on the interconnections 43. Bumps may be formed on the front and rear faces of the substrate. Thereafter, the semiconductor substrate 21 is divided into chips having a semiconductor device with a through electrode.

Figure 15:
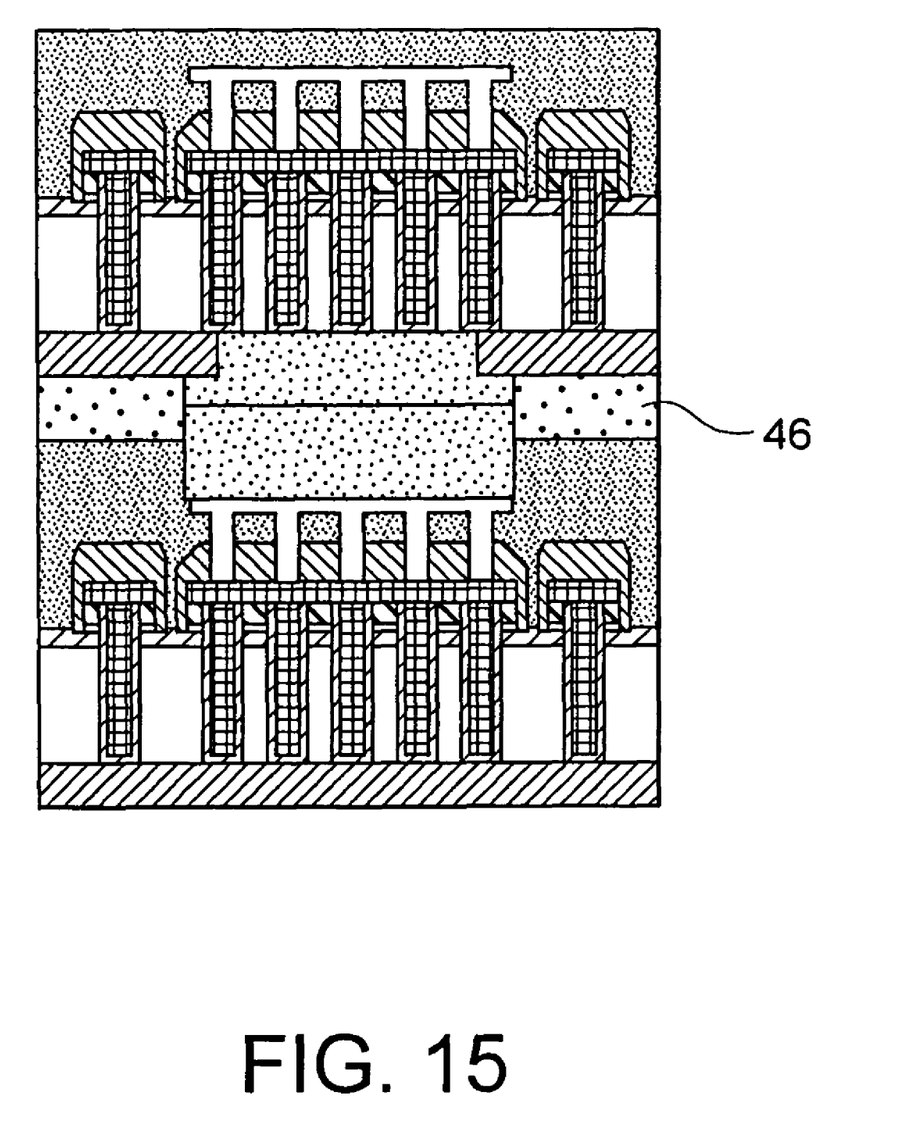
FIG. 15 is a cross-sectional view showing a three-dimensional semiconductor device according to the present invention.

FIG. 15 shows a three-dimensional semiconductor device having two stacked semiconductor devices. A front face of an upper semiconductor device, in which transistors and interconnections are formed, is protected by a protective layer. The upper semiconductor device is connected to a lower semiconductor device via a bump formed on a rear face thereof. A rear face of the lower semiconductor device is protected by an insulation film. The upper semiconductor device is connected to the upper semiconductor device via a bump formed on a front face thereof. In order to maintain the reliability and electric characteristics of the upper semiconductor device and the lower semiconductor device, it is desirable to seal a space between the upper and lower semiconductor devices by an adhesive layer 46 made of resin. Thus, by stacking semiconductor devices each having a through electrode, it is possible to produce a small-sized three-dimensional semiconductor device.

According to a method of manufacturing a through electrode in the present example, a through electrode is formed while a first conductive film for a gate electrode is used as a mask. A refractory metal or a compound thereof, which is used for the gate electrode, can be used to form a through electrode. Accordingly, the through electrode can have a low resistance. Further, the through electrode can be protected simultaneously by a nitride film for covering the gate electrode, Therefore, it is possible to prevent contamination. Thus, the manufacturing method according to the present invention can be applied to a usual semiconductor process with common steps. With such common steps, it is possible to reduce the number of steps dedicated to formation of a through electrode, shorten a required process time, and use common mass production facilities.

Further, a through electrode according to the present invention has an inner through electrode, and a peripheral through electrode and an annular semiconductor in a floating state around the inner through electrode. The inner through electrode includes columnar semiconductors arranged therein at equal intervals. The inner through electrode can be formed by using a conductive thin film having a small thickness. Since the annular semiconductor and the peripheral through electrode are provided so as to be in a floating state, the capacity between the semiconductor substrate and the inner through electrode can be dramatically reduced. With such an arrangement and manufacturing method of the through electrode, it is possible to provide a through electrode which has a low resistance and a small capacity and is easy to manufacture. Further, a semiconductor device which can perform high-speed data transfer can be provided with provision of this through electrode.

Although certain preferred embodiment and example of the present invention have been shown and described in detail, the present invention is not limited to the illustrated examples. It should be understood that various changes and modifications may be made therein without departing from the scope of the appended claims. Further, the illustrated examples include inventions at various stages, and thus various inventions can be extracted from proper combinations of the disclosed elements or processes. For example, inventions can be extracted from this disclosure as long as desired effects can be achieved even if some of the disclosed elements or processes are eliminated.

What is claimed is:

1. A semiconductor device comprising:
    an inner trench for an inner through electrode formed in a semiconductor substrate and having a columnar semiconductor, said inner trench being formed while at least a first conductive film formed on said semiconductor substrate for a gate electrode is used as a mask;
    a peripheral trench for a peripheral through electrode formed on the semiconductor substrate around an annular semiconductor surrounding said inner trench for said inner through electrode, said peripheral trench being formed while at least the first conductive film for the gate electrode is used as the mask; and
    said inner through electrode and said peripheral through electrode formed by etching said first conductive film and filling said inner trench and said peripheral trench with a through electrode insulation film and a through electrode conductive film, respectively.

2. The semiconductor device claimed in claim 1, wherein said columnar semiconductor is provided in said inner through electrode.

3. The semiconductor device claimed in claim 2, further comprising:
    a second conductive film for the gate electrode, said second conductive film being formed on said first conductive film,
    wherein a connecting portion of said inner through electrode is formed by said second conductive film while said peripheral through electrode is in a floating state.

4. The semiconductor device claimed in claim 3, wherein said first conductive film comprises at least one of polysilicon and compounds comprising refractory metal and silicon.

5. The semiconductor device claimed in claim 3, wherein said second conductive film comprises at least one of refractory metal, silicides comprising refractory metal, and nitrides comprising refractory metal.

6. The semiconductor device claimed in claim 3, wherein said through electrode conductive film comprises at least one of refractory metal, silicides comprising refractory metal, and nitrides comprising refractory metal.

7. The semiconductor device claimed in claim 1, wherein said peripheral through electrode and said annular semiconductor are in a floating state in which no potential is supplied.

8. The semiconductor device claimed in claim 1, wherein said columnar semiconductor has one of a square and a rectangular shape spaced from said annular semiconductor at equal intervals, and
    wherein said inner through conductive film is filled into the equal intervals.

9. The semiconductor device claimed in claim 1, wherein said columnar semiconductor comprises a plurality of columnar semiconductor portions having one of a square and a rectangular shape,
    wherein said plurality of columnar semiconductor portions are spaced from said annular semiconductor and an adjacent columnar semiconductor portion at equal intervals, and
    wherein said inner through conductive film is filled into the equal intervals.

10. The semiconductor device claimed in claim 1, further comprising:
    a plurality of peripheral layers outside of said peripheral through electrode, said plurality of peripheral layers comprising an additional annular semiconductor and an additional peripheral through electrode.

11. A semiconductor device comprising:
    a through electrode, comprising:
        at least one columnar semiconductor placed within an inner trench with a gap left between the at least one columnar semiconductor and sides of the inner trench;
        an inner through electrode embedded within the gap;
        a through electrode insulation film being formed in the inner trench;
        a peripheral through electrode embedded within an outer trench surrounding said inner through electrode; and
        a through electrode conductive film being formed in the outer trench.

12. The semiconductor device as claimed in claim 11, further comprising:
    a ring-shaped semiconductor which surrounds the inner through electrode and which is placed between the inner through electrode and the peripheral through electrode.

13. The semiconductor device as claimed in claim 12, wherein the peripheral through electrode and the ring-shaped semiconductor are supplied with no electric potential and are kept in an electric floating state.

14. The semiconductor device as claimed in claim 11, wherein the at least one columnar semiconductor has one of a square shape and a rectangular shape to define a substantially uniform gap between the at least one columnar semiconductor and the peripheral through electrode.

15. The semiconductor device as claimed in claim 11, wherein a plurality of columnar semiconductors comprising the at least one columnar semiconductor are arranged within the inner trench in a matrix manner.

16. The semiconductor device as claimed in claim 15, further comprising:
    a ring-shaped semiconductor which surrounds the inner through electrode and which is placed between the inner through electrode and the peripheral through electrode.

17. The semiconductor device as claimed in claim 16, wherein said through electrode insulation film comprises:
    an insulating layer interposed between the inner through electrode and the plurality of columnar semiconductors; and another insulating layer interposed between the inner through electrode and the ring-shaped semiconductor.

18. The semiconductor device as claimed in claim 16, wherein said through electrode insulation film comprises an outer insulating layer interposed between the ring-shaped semiconductor and the peripheral through electrode.

19. The semiconductor device claimed in claim 11, wherein said inner and the peripheral through electrodes comprise at least one of polysilicon and compounds comprising refractory metal and silicon.

20. A semiconductor device comprising:
   a through electrode, comprising:
      a semiconductor device which comprises plural semiconductor devices, said plural semiconductor devices being stuck on each other;
      a set of semiconductor pillars, the semiconductor pillars being arranged adjacently to one another to form a first gap thereamong;
      a semiconductor ring formed to surround the set of semiconductor pillars to form a second gap therebetween;
      a first conductive material formed to fill the first and second gaps; and
      a second conductive material formed to surround the semiconductor ring,
   wherein at least one of said plural semiconductor devices comprises the semiconductor device claimed in claim 11.

21. The device as claimed in claim 20, wherein the semiconductor ring and the second conductive material are in an electrical floating state.

22. The device as claimed in claim 21, further comprising:
   a first insulating film intervening between the set of semiconductor pillars and the first conductive material;
   a second insulating film intervening between the first conductive material and the semiconductor ring; and
   a third insulating film intervening between the semiconductor ring and the second conductive material.

23. The device as claimed in claim 21, wherein the set of semiconductor pillars is arranged in a matrix form including a plurality of rows and columns.

24. A semiconductor device, comprising:
   a through electrode, comprising:
      a set of semiconductor pillars formed in an inner trench, the semiconductor pillars being arranged adjacently to one another to form a first gap thereamong;
      a through electrode insulation film being formed in the inner trench;
      a semiconductor ring formed to surround the set of semiconductor pillars to form a second gap therebetween;
      a first conductive material formed to fill the first and second gaps;
      a second conductive material formed in an outer trench to surround the semiconductor ring; and
      a through electrode conductive film being formed in the outer trench.

25. The device as claimed in claim 24, wherein the semiconductor ring and the second conductive material are in an electrical floating state.

26. The device as claimed in claim 25, wherein the set of semiconductor pillars is arranged in a matrix form including a plurality of rows and columns.

27. The device as claimed in claim 24, further comprising:
   a first insulating film intervening between the set of semiconductor pillars and the first conductive material;
   a second insulating film intervening between the first conductive material and the semiconductor ring; and
   a third insulating film intervening between the semiconductor ring and second conductive material.

* * * * *